United States Patent
Fujino et al.

(10) Patent No.: US 9,674,946 B2
(45) Date of Patent: Jun. 6, 2017

(54) CONDUCTIVE LAMINATE, TRANSPARENT CONDUCTIVE LAMINATE WITH PATTERNED WIRING, AND OPTICAL DEVICE

(75) Inventors: Nozomi Fujino, Ibaraki (JP); Motoki Haishi, Ibaraki (JP); Koichiro Tada, Ibaraki (JP); Yoshimasa Sakata, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 18 days.

(21) Appl. No.: 14/126,278

(22) PCT Filed: Jun. 14, 2012

(86) PCT No.: PCT/JP2012/065253
§ 371 (c)(1),
(2), (4) Date: Dec. 13, 2013

(87) PCT Pub. No.: WO2012/173192
PCT Pub. Date: Dec. 20, 2012

(65) Prior Publication Data
US 2014/0102764 A1    Apr. 17, 2014

(30) Foreign Application Priority Data
Jun. 17, 2011 (JP) ................................. 2011-135436

(51) Int. Cl.
*H05K 1/09* (2006.01)
*B32B 15/04* (2006.01)
(Continued)

(52) U.S. Cl.
CPC ............. *H05K 1/0274* (2013.01); *B32B 9/04* (2013.01); *B32B 15/04* (2013.01); *B32B 15/08* (2013.01);
(Continued)

(58) Field of Classification Search
CPC ... C23C 14/086; C23C 14/3492; G06F 3/044; G06F 3/045; G06F 2203/04103;
(Continued)

(56) References Cited

U.S. PATENT DOCUMENTS 6,743,488 B2 * 6/2004 Memarian ........... C23C 14/0036
257/E31.126
2003/0035906 A1   2/2003 Memarian et al.
(Continued)

FOREIGN PATENT DOCUMENTS

CN          1525912 A    9/2004
CN        101277564 A    3/2008
(Continued)

OTHER PUBLICATIONS

Taiwanese Office Action dated Nov. 12, 2014, issued in corresponding TW Application No. 101121633 (12 pages).
(Continued)

*Primary Examiner* — Hoa C Nguyen
(74) *Attorney, Agent, or Firm* — Westerman, Hattori, Daniels & Adrian, LLP

(57) ABSTRACT

In a conductive laminate, a transparent conductive thin film laminate 2 including at least two transparent conductive thin films and a metal layer 3 are formed in this order on at least one surface of a transparent base. In the transparent conductive thin film laminate 2, a first transparent conductive thin film 21 that is closest to the metal layer 3 is a metal oxide layer, or a composite metal oxide layer containing a principal metal and at least one impurity metal. Transparent conductive thin film 22 other than the first transparent conductive thin film is a composite metal oxide layer containing a principal metal and at least one impurity metal. The content ratio of impurity metal in the first transparent conductive thin film is not the highest of content ratios of (Continued)

impurity metal in the transparent conductive thin films which form the transparent conductive thin film laminate 2.

20 Claims, 3 Drawing Sheets

(51) Int. Cl.

| | | |
|---|---|---|
| *B32B 9/04* | (2006.01) |
| *H05K 1/02* | (2006.01) |
| *C23C 14/08* | (2006.01) |
| *C23C 14/34* | (2006.01) |
| *H05K 3/46* | (2006.01) |
| *G06F 3/044* | (2006.01) |
| *G06F 3/045* | (2006.01) |
| *B32B 15/08* | (2006.01) |
| *B32B 15/20* | (2006.01) |
| *B32B 27/16* | (2006.01) |
| *B32B 27/28* | (2006.01) |
| *B32B 27/30* | (2006.01) |
| *B32B 27/32* | (2006.01) |
| *B32B 27/34* | (2006.01) |
| *B32B 27/36* | (2006.01) |
| *B32B 27/40* | (2006.01) |
| *B32B 27/42* | (2006.01) |

(52) U.S. Cl.
CPC .............. *B32B 15/20* (2013.01); *B32B 27/16* (2013.01); *B32B 27/281* (2013.01); *B32B 27/283* (2013.01); *B32B 27/30* (2013.01); *B32B 27/32* (2013.01); *B32B 27/34* (2013.01); *B32B 27/36* (2013.01); *B32B 27/365* (2013.01); *B32B 27/40* (2013.01); *B32B 27/42* (2013.01); *C23C 14/086* (2013.01); *C23C 14/3492* (2013.01); *G06F 3/044* (2013.01); *G06F 3/045* (2013.01); *H05K 3/46* (2013.01); *B32B 2255/205* (2013.01); *B32B 2307/202* (2013.01); *B32B 2307/412* (2013.01); *B32B 2307/584* (2013.01); *B32B 2551/00* (2013.01); *G06F 2203/04103* (2013.01); *Y10T 428/2495* (2015.01)

(58) Field of Classification Search
CPC ........ H05K 3/46; H05K 1/0306; H05K 1/092; B32B 15/00; H01L 31/022475; H01L 31/022466; H01L 31/022483; H01L 2251/308
USPC ................................................. 174/255–257
See application file for complete search history.

(56) References Cited

U.S. PATENT DOCUMENTS

| | | | |
|---|---|---|---|
| 2008/0176042 A1 | 7/2008 | Nashiki et al. | |
| 2008/0261030 A1 | 10/2008 | Nashiki et al. | |
| 2009/0133743 A1 | 5/2009 | Matsui | |
| 2009/0194161 A1 | 8/2009 | Ji et al. | |
| 2009/0284141 A1* | 11/2009 | Sakanoue | H01L 51/5088 313/504 |
| 2010/0060602 A1* | 3/2010 | Agari | G06F 3/044 345/173 |
| 2010/0170696 A1 | 7/2010 | Yano et al. | |
| 2011/0181545 A1* | 7/2011 | Takahashi | G06F 3/041 345/174 |
| 2012/0012370 A1 | 1/2012 | Nashiki et al. | |
| 2013/0118774 A1 | 5/2013 | Yano et al. | |
| 2014/0102764 A1 | 4/2014 | Fujino et al. | |

FOREIGN PATENT DOCUMENTS

| | | |
|---|---|---|
| EP | 0265110 A1 | 4/1988 |
| JP | 63-102928 A | 5/1988 |
| JP | 63-113585 A | 5/1988 |
| JP | 08-043841 A | 2/1996 |
| JP | 11-335815 A | 12/1999 |
| JP | 2005-141981 A | 6/2005 |
| JP | 2005-244083 A | 9/2005 |
| JP | 2005-268616 A | 9/2005 |
| JP | 2006-244771 A | 9/2006 |
| JP | 2007-115431 A | 5/2007 |
| JP | 2007-311242 A | 11/2007 |
| JP | 2008-071531 A | 3/2008 |
| JP | 2009-093911 A | 4/2009 |
| JP | 2010-061942 A | 3/2010 |
| JP | 2010-212085 A | 9/2010 |
| JP | 2011-034806 A | 2/2011 |
| JP | 2011-511470 A | 4/2011 |
| JP | 2011-103289 A | 5/2011 |
| JP | 5473990 B2 | 4/2014 |
| TW | 201111175 A | 4/2011 |
| TW | 201112272 A | 4/2011 |
| WO | 2011/013696 A1 | 2/2011 |

OTHER PUBLICATIONS

Office Action dated May 26, 2015, issued in counterpart Chinese Patent Application No. 201280029923.9, with English translation (26 pages).
Japanese Office Action dated Jan. 29, 2015, issued in JP Patent Application No. 2014-019196 with English translation (6 pages).
Korean Office Action dated Mar. 5, 2015, issued in corresponding KR Patent Application No. 10-2013-7030243 with English translation (12 pages).
Extended European Search Report dated Jan. 28, 2015, issued in corresponding EP Application No. 12800306.8 (6 pages).
Taiwanese Office Action dated Feb. 26, 2015, issued in corresponding TW Patent Application No. 101121633 with English translation (14 pages).
Notification of Translation of the International Preliminary Report on Patentability of PCT/JP2012/065253, dated Jan. 3, 2014 (forms PCT/IB/338, PCT/IB/373 and PCT/ISA/237) (10 pages).
International Search Report, dated Jul. 31, 2012, issued in corresponding application No. PCT/JP2012/065253.
Office Action, dated Oct. 23, 2013, issued in corresponding Japanese application No. JP2011-135436.
Korean Notice of Final Rejection dated Sep. 21, 2015, issued in counterpart Korean Patent Application No. 10-2013-7030243, w/English translation (6 pages).
Office Action dated Nov. 26, 2015, issued in counterpart Korean Patent Application No. 10-2013-7030243, with English translation. (12 pages).
Office Action dated Jan. 21, 2016, issued in counterpart Chinese Patent Application No. 201280029923.9, with English translation. (31 pages).
Office Action dated Jul. 8, 2016, issued in counterpart Chinese Patent Application No. 201280029923.9, with English translation. (25 pages).
Decision of Rejection dated Feb. 7, 2017, issued in counterpart Chinese Patent Application No. 201280029923.9, with English translation. (31 pages).

* cited by examiner

CONDUCTIVE LAMINATE, TRANSPARENT CONDUCTIVE LAMINATE WITH PATTERNED WIRING, AND OPTICAL DEVICE

TECHNICAL FIELD

The present invention relates to a conductive laminate in which a transparent conductive thin film and a metal layer are provided on a transparent base, and a transparent conductive laminate with patterned wiring, which is formed from the conductive laminate. Further, the present invention relates to an optical device, such as a display device and a touch panel, which use the transparent conductive laminate with patterned wiring.

BACKGROUND ART

In flat panel displays such as a liquid crystal display, a plasma display and an organic electro-luminescent display, and display devices such as a touch panel, a transparent electrode formed of a transparent conductive oxide such as indium tin oxide (ITO) is used. Patterned wiring is connected to this transparent electrode for the purpose of giving a voltage from the outside or detecting an electric potential on the transparent electrode. As the patterned wiring, those obtained by forming a silver paste by a screen printing method or the like are widely used. Generally, in a display device, wiring is pattern-formed so as to be routed along the periphery of a transparent electrode as schematically shown in FIG. 6. By using a decorated base or the like, the display device is assembled such that the wiring is not visually recognized from the outside.

Patterns of routed wiring tend to be complicated as the definition and function of display devices are enhanced. In the case of touch panels, for example, capacitive touch panels and resistive touch panels, which allow multi-point input (multi-touch), have recently come into the spotlight. In these types of touch panels, a transparent conductive thin film is patterned in a predetermined shape (e.g. stripe shape) to form transparent electrodes, and patterned wiring is formed between each transparent electrode and control means such as an IC. While patterns of wiring become complicated as described above, it is desired to increase an area ratio of a display region in a display device by further narrowing a peripheral region that is decorated so that routed wiring is not visually recognized (narrowing of a frame). However, in the aforementioned method of printing a silver paste, there is a limitation to reduction of a line width of an electrode, and therefore it is difficult to further narrow a frame of a display device.

For further narrowing a frame of a display device, it is necessary to reduce the width of patterned wiring and use a wiring material having high conductivity in order to suppress an increase in resistance of wiring. From such a view point, a method has been proposed in which a transparent conductive thin film 25 is formed on a base 1, a metal layer 3 formed of copper is formed thereon to prepare a laminate 11, and the metal layer 3 and the transparent conductive thin film 25 are sequentially selectively removed by etching to perform patterning as shown in FIG. 4 (for example, Patent Document 1).

On the other hand, in addition to the aforementioned requirement of narrowing a frame, it is desired to use a low-resistance transparent conductive thin film for improvement of the sensor sensitivity and resolution of a transparent electrode. Particularly in the capacitive touch panel, a minute change in electrostatic capacity between transparent electrodes is sensed to detect a position, and it is desired to lower the resistance of a transparent conductive thin film for improvement of the accuracy of positional detection and reduction of response time. Further, resistance property is of vital importance in determination of the sensor sensitivity and the like, and therefore it is important that the transparent conductive thin film retains stable resistance property during mass production.

PRIOR ART DOCUMENT

Patent Document

Patent Document 1: JP-A-63-113585

SUMMARY OF THE INVENTION

Problems to be Solved by the Invention

According to a method as described in Patent Document 1, patterned wiring can be formed by etching, so that the width of patterned wiring can be reduced, and a frame of a display device can be narrowed. However, as a result of studies by the present inventors, it has been found that a transparent conductive thin film after removal of a metal layer by etching may have an increased resistance as compared to the transparent conductive thin film before formation of the metal layer, and particularly in a low-resistance transparent conductive thin film, an increase in resistance after removal of a metal layer by etching is significant.

In view of the situation described above, an object of the present invention is to provide a conductive laminate which is suitable for formation of a transparent conductive laminate with patterned wiring because an increase in resistance of a transparent conductive thin film is suppressed even after a metal layer is removed by etching to form patterned wiring.

Means for Solving the Problems

The present inventors have conducted extensive studies, and resultantly found that when a transparent conductive thin film is a laminate of two or more transparent conductive thin films having different contents of impurity metal, an increase in resistance is suppressed, and thus completed the present invention.

The present invention relates to a conductive laminate in which a transparent conductive thin film laminate including at least two transparent conductive thin films and a metal layer are formed in this order on at least one surface of a transparent base. In the transparent conductive thin film laminate, a first transparent conductive thin film that is closest to the metal layer is a metal oxide layer, or a composite metal oxide layer containing a principal metal and at least one impurity metal. A transparent conductive thin film other than the first transparent conductive thin film in the transparent conductive thin film laminate is a composite metal oxide layer containing a principal metal and at least one impurity metal. In the conductive laminate of the present invention, the content ratio of impurity metal in the first transparent conductive thin film is not the highest of content ratios of impurity metal in the transparent conductive thin films which form the transparent conductive thin film laminate.

In the present invention, the content ratio of impurity metal in the first transparent conductive thin film is preferably the lowest of the content ratios of impurity metal in the transparent conductive thin films which form the transparent conductive thin film laminate. Further, a difference between the content ratio of impurity metal in a transparent conductive thin film having the highest content ratio of impurity metal in the transparent conductive thin film laminate and the content ratio of impurity metal in the first transparent conductive thin film is preferably 0.005 to 0.23.

In the present invention, the content ratio of impurity metal in the first transparent conductive thin film is preferably 0.08 or less. Further, the content ratio of impurity metal in a transparent conductive thin film having the highest content ratio of impurity metal in the transparent conductive thin film laminate is preferably 0.04 to 0.31.

The thickness of the first transparent conductive thin film is preferably 6% or more based on the total thickness of the transparent conductive thin film laminate. Further, the thickness of the first transparent conductive thin film is preferably less than 50% based on the total thickness of the transparent conductive thin film laminate.

In one embodiment of the present invention, all transparent conductive thin films, which form the transparent conductive thin film laminate, have In as a principal metal. In this case, preferably Sn is contained as an impurity metal. In the embodiment, the content ratio of Sn to In in the first transparent conductive thin film is preferably 0.08 or less. The entire content ratio of Sn to In in a transparent conductive thin film, other than the first conductive thin film, which forms the transparent conductive thin film laminate, is preferably 0.08 to 0.13.

In one embodiment of the present invention, the transparent conductive thin film laminate includes two layers: the first transparent conductive thin film and one transparent conductive thin film formed on the base side from the first transparent conductive thin film. In one embodiment of the present invention, the first transparent conductive thin film and the metal layer are adjacent to each other. In one embodiment of the present invention, all transparent conductive thin films, which form the transparent conductive thin film laminate, are crystalline films. In one embodiment of the present invention, the transparent base is a flexible film.

Further, the present invention relates to a transparent conductive laminate with patterned wiring, which can be produced using the conductive laminate. The transparent conductive laminate has a transparent base, and a transparent electrode portion including a plurality of patterned transparent electrodes and, patterned wiring portions on the transparent base, the patterned wiring portions being connected to the transparent electrode portions. The transparent conductive laminate with patterned wiring is obtained by removing a part in the surface of the metal layer of the conductive laminate by etching to form patterned wiring portions, and removing a part in the surface of the transparent conductive thin film laminate by etching, at exposed portions of the transparent conductive thin film laminate where the metal layer is removed, to form patterned transparent electrodes.

Effects of the Invention

A conductive laminate of the present invention has a transparent conductive thin film laminate including at least two transparent conductive thin films as a transparent conductive layer, and has a relatively low impurity metal content ratio in a first transparent conductive thin film that is closest to a metal layer. Therefore, an increase in resistance of the transparent conductive thin film laminate is suppressed even after a part in the surface of the metal layer formed on the transparent conductive thin film laminate is removed to perform patterning. A transparent conductive laminate with patterned wiring, which is formed by patterning the conductive laminate of the present invention by etching, has a low-resistance transparent conductive thin film and can retain stable resistance property.

MODES FOR CARRYING OUT THE INVENTION

Figure 1:
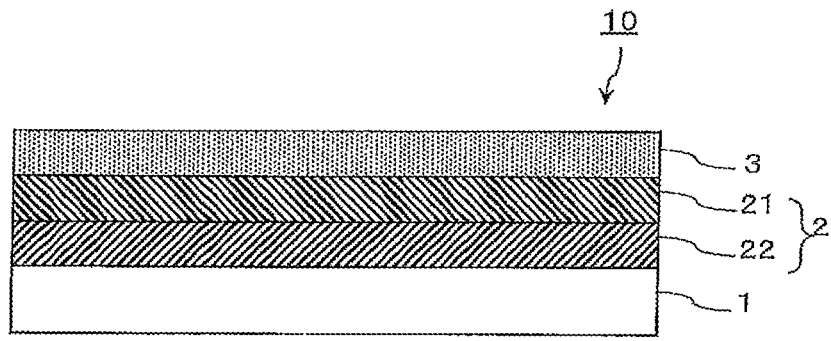
FIG. 1 is a schematic sectional view of a conductive laminate according to one embodiment of the present invention.
Figure 5:
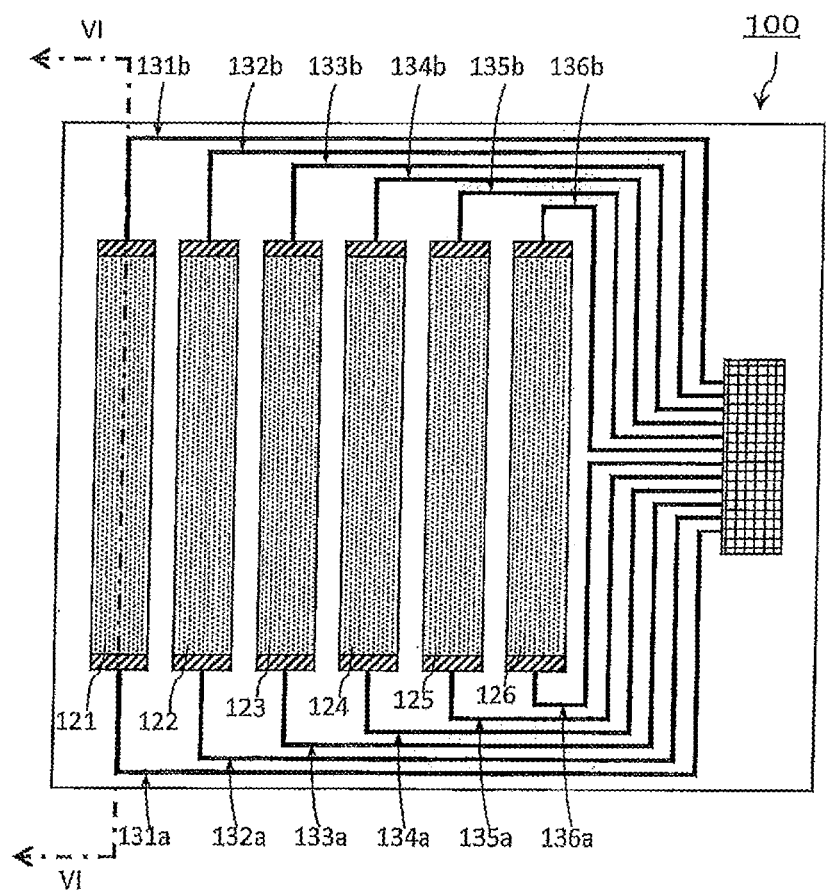
FIG. 5 is a schematic plan view of a transparent conductive laminate with patterned wiring according to one embodiment of the present invention.
Figure 6:
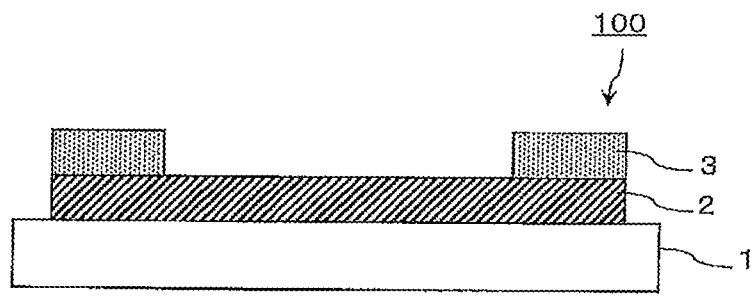
FIG. 6 is a drawing schematically showing a cross section along the VI-VI line in FIG. 5.

Embodiments of the present invention will be described below with reference to the drawings. FIG. 1 is a schematic sectional view showing one embodiment of a conductive laminate of the present invention, FIG. 5 is a schematic plan view of a transparent conductive laminate with patterned wiring according to the present invention, and FIG. 6 is a sectional view schematically showing a cross section along the VI-VI line in FIG. 5. A conductive laminate 10 of the present invention has a transparent conductive thin film laminate 2 and a metal layer 3 formed sequentially on at least one surface of a transparent base 1. The transparent conductive thin film laminate 2 includes at least two transparent conductive thin films 21 and 22.

<Conductive Laminate>

(Transparent Base)

The transparent base 1 is not particularly limited as long as it is transparent in a visible light range, and glass and various kinds of plastic films having transparency are used. When a transparent conductive laminate with patterned wiring as described later is used for a transparent electrode of a touch panel, a flexible display or the like, it is preferable to use a flexible film such as a plastic film as a transparent base. Examples of the material of the plastic film include a polyester-based resin, an acetate-based resin, a polyethersulfone-based resin, a polycarbonate-based resin, a polyamide-based resin, a polyimide-based resin, a polyolefin-based resin, a (meth)acryl-based resin, a polyvinyl chloride-based resin, a polyvinylidene chloride-based resin, a polystyrene-based resin, a polyvinyl alcohol-based resin, a polyarylate-based resin and a polyphenylene sulfide-based resin. Among them, especially preferable are a polyester-based resin, a polycarbonate-based resin and a polyolefin-based resin.

When a plastic film is used as the transparent base, the thickness thereof is preferably in a range of 2 to 200 μm, more preferably in a range of 2 to 100 μm. When the thickness of the film is less than 2 μm, the mechanical strength of the transparent base becomes insufficient, so that an operation of continuously forming the transparent conductive thin film laminate 2 and the metal layer 3 with the film formed in a roll shape may be difficult. On the other hand, when the thickness of the film is more than 200 μm, the thickness of a device increases, and also the transparent conductive thin film tends to have poor scratch resistance.

The surface of the transparent base may be subjected beforehand to an etching treatment or an undercoating treatment such as sputtering, corona discharge, flame treatment, ultraviolet ray irradiation, electron beam irradiation, chemical conversion or oxidation to improve adhesion with the transparent conductive thin film formed on the film base. Further, the surface of the base may be freed of dust and cleaned by solvent cleaning or ultrasonic cleaning as necessary before the transparent conductive thin film is formed.

A dielectric layer or a hard coat layer may be formed on a surface of the transparent base 1 on which the transparent conductive thin film laminate 2 is formed. The dielectric layer formed on a surface of the transparent base, on which the transparent conductive thin film laminate is formed, does not have a function as a conductive layer, and has a surface resistance of, for example, $1 \times 10^6 \Omega/\square$ or more, preferably $1 \times 10^7 \Omega/\square$ or more, further preferably $1 \times 10^8 \Omega/\square$ or more. The upper limit of the surface resistance of the dielectric layer is not particularly specified. Generally, the upper limit of the surface resistance of the dielectric layer is about $1 \times 10^{13} \Omega/\square$, i.e. a measurement limit, but it may be more than $1 \times 10^{13} \Omega/\square$.

Examples of the material of the dielectric layer include inorganic substances such as NaF (1.3), $Na_3AlF_6$ (1.35), LiF (1.36), $MgF_2$ (1.38), $CaF_2$ (1.4), $BaF_2$ (1.3), $BaF_2$ (1.3), $SiO_2$ (1.46), $LaF_3$ (1.55), CeF (1.63) and $Al_2O_3$ (1.63) (the numerical value in the parentheses shows a refractive index), organic substances such as an acryl resin, a urethane resin, a melamine resin, an alkyd resin, a siloxane-based polymer and an organic silane condensation product, which have a refractive index of about 1.4 to 1.6, and mixtures of the inorganic substances and the organic substances.

By forming a dielectric layer on a side of the transparent base on which the transparent conductive thin film is formed, a difference in visibility between a transparent conductive thin film-formed region and a transparent conductive thin film-non-formed region can be reduced even when the transparent conductive thin film laminate 2 is patterned into a plurality of regions. When a film base is used as the transparent base, the dielectric layer can act as a sealing layer for suppressing precipitation of low-molecular-weight components such as an oligomer from the plastic film.

Figure 2:
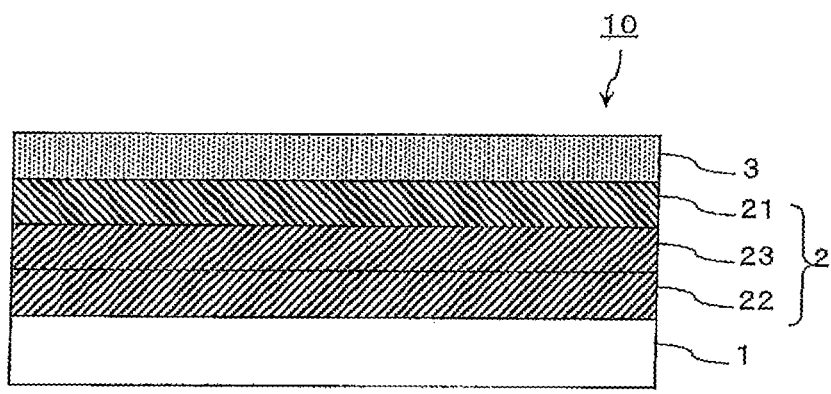
FIG. 2 is a schematic sectional view of a conductive laminate according to one embodiment of the present invention.
Figure 3:
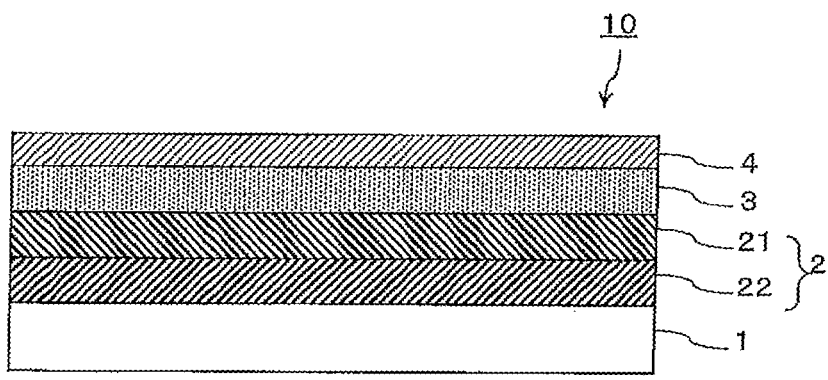
FIG. 3 is a schematic sectional view of a conductive laminate according to one embodiment of the present invention.

A hard coat layer or the like may be provided as necessary on a surface of the transparent base 1 which is opposite to the surface on which the transparent conductive thin film laminate 2 is formed. Other bases may be bonded using appropriate bonding means such as a pressure-sensitive adhesive, or a protective layer such as a separator may be temporarily bonded to a pressure-sensitive adhesive layer or the like for bonding with other bases. FIGS. 1 to 3 show a configuration in which the transparent conductive thin film laminate 2 and the metal layer 3 are formed on only one surface of the transparent base 1, but transparent conductive thin film laminates and metal layers may be formed on both surfaces of the transparent base.

(Transparent Conductive Thin Film Laminate)

The transparent conductive thin film laminate 2 is formed on the transparent base 1. The transparent conductive thin film laminate is formed by laminating at least two transparent conductive thin films 21 and 22. The transparent conductive thin film laminate 2 may have three transparent conductive thin films 21, 22 and 23 as shown in FIG. 2, or may have four or more transparent conductive thin films.

All of these transparent conductive thin films are thin films having a conductive oxide of a metal as a principal component, or thin films having as a principal component a composite metal oxide containing a principal metal and at least one impurity metal. These conductive thin films are not particularly limited for their constituent materials as long as they are transparent and have conductivity, and metal oxides having as a principal component one metal selected from the group consisting of Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, Ga, Ti, Ge, In, Sn, Pb, As, Sb, Bi, Se, Te and I are suitably used. From the viewpoint of transparency and conductivity of the transparent conductive thin film, the principal metal element is preferably any one of In, Zn and Sn, and most preferably In. When the transparent conductive thin film is made of a composite metal oxide containing a principal metal and impurity metal(s), at least one metal selected from the aforementioned group are suitably used as the impurity metal(s).

As the impurity metal(s) in the composite metal oxide, those having a valence electron number larger than that of the principal metal are suitably used for increasing the carrier density of the transparent conductive thin film to lower the resistance of the transparent conductive thin film. Examples of the composite metal oxide include tin-doped indium oxide (ITO), antimony-doped tin oxide (ATO), aluminum-doped zinc oxide (AZO), gallium-doped zinc oxide (GZO) and indium-doped zinc oxide (IZO). Particularly, for forming a low-resistance and high-transparency transparent conductive thin film, ITO is most suitably used.

The present invention is characterized in that the content ratio of impurity metal in the first transparent conductive thin film 21 that is closest to the metal layer 3 formed on the transparent conductive thin film laminate 2 is not the highest of the content ratios of impurity metal in the transparent conductive thin films 22 and 23 which form the transparent conductive thin film laminate. For example, when the transparent conductive thin film laminate 2 includes two transparent conductive thin films 21 and 22 as shown in FIG. 1, the content ratio of impurity metal in the first transparent conductive thin film 21 on a side close to the metal layer 3 is lower than the content ratio of impurity metal in the transparent conductive thin film 22 on the transparent base 1 side.

By decreasing the content ratio of impurity metal in the first transparent conductive thin film 21 that is closest to the metal layer 3 as described above, a change in resistance of the transparent conductive thin film laminate is suppressed when the metal layer 3 is formed on the transparent conductive thin film laminate 2 and a part in the surface thereof is removed by etching to perform patterning.

Figure 4:
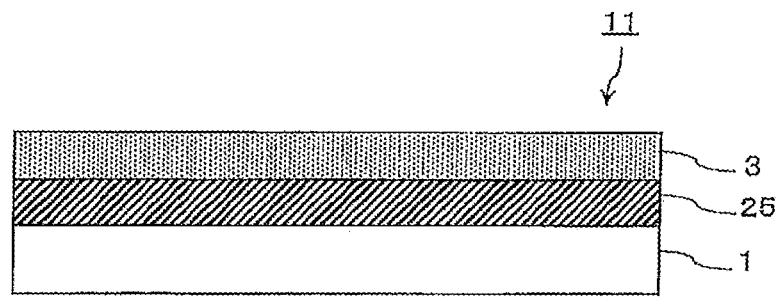
FIG. 4 is a schematic sectional view showing one form of a conductive laminate in the conventional technique.

As a result of studies by the present inventors, it has been found that if the content ratio of impurity metal in a transparent conductive thin film is high, the carrier density easily decreases to increase the resistance when a metal layer formed on the transparent conductive thin film is removed by etching. That is, in a configuration in which the metal layer 3 is laminated on one transparent conductive thin film 25 as shown in FIG. 4, the resistance of the conductive film 25 after removal of the metal layer 3 by etching tends to increase when a composite metal oxide having a high impurity metal content ratio is used to ensure that the transparent conductive thin film 25 is a low-resistance film.

On the other hand, in the present invention, the composite oxide thin film 22 having a relatively high content ratio of impurity metal is used on the base 1 side, and the composite oxide thin film 21 having a relatively low content ratio of impurity metal is used on the metal layer 3 side, so that the specific resistivity of the whole transparent conductive thin film laminate is low, and an increase in resistance when the metal layer 3 is removed by etching is suppressed. The content ratio of impurity metal is represented by the ratio of the number of atoms $N_D$ of impurity metal elements to the number of atoms $N_P$ of a principal metal element in the transparent conductive thin film.

The reason why an increase in resistance when the metal layer is etched away is suppressed by decreasing the content ratio of impurity metal in the first transparent conductive thin film 21 is not known. One of presumable reasons is that when the impurity metal content ratio is high, the carrier density of the transparent conductive thin film tends to decrease due to formation of a complex, or the like, by a chemical species in an etchant used for removal of the metal layer and an impurity metal, and by decreasing the content ratio of the impurity metal, an increase in resistance by such influences of the etchant is suppressed.

When the transparent conductive thin film laminate 2 includes two transparent conductive thin films 21 and 22 as shown in FIG. 1, a difference between the content ratio of impurity metal in the transparent conductive thin film 22 on the transparent base 1 side and the content ratio of impurity metal in the first transparent conductive thin film 21 on a side close to the metal layer 3 is preferably 0.005 to 0.23, more preferably 0.01 to 0.23, further preferably 0.02 to 0.23. The range of the content ratio of the impurity metal is generally 0.5% to 20%, 1% to 20% or 2% to 20% in terms of a difference in Sn atom content between the transparent conductive thin film on the transparent base side and the first transparent conductive thin film 21 on the metal layer side (weight of $SnO_2$ relative to the total weight of $In_2O_3$ and $SnO_2$) where an indium-tin composite oxide (ITO) is used as the composite metal oxide thin film which forms the transparent conductive thin film, i.e. the principal metal is indium and the impurity metal is tin.

When the transparent conductive thin film laminate 2 includes three or more transparent conductive thin films as shown in FIG. 2, a difference between the content ratio of impurity metal in a transparent conductive thin film having the highest content ratio of impurity metal in the transparent conductive thin film laminate 2 and the content ratio of impurity metal in the first transparent conductive thin film 21 on a side close to the metal layer 3 is preferably 0.005 to 0.23, more preferably 0.01 to 0.23, further preferably 0.02 to 0.23. From a viewpoint that an increase in resistance when the metal layer is etched is suppressed while the transparent conductive thin film laminate is a low-resistance film, a difference between the content ratio of impurity metal where the transparent conductive thin films 22 and 23 other than the first transparent conductive thin film 21 on a side close to the metal layer 3 in the transparent conductive thin film laminate 2 are considered as one film and the content ratio of impurity metal in the first transparent conductive thin film 21 is preferably in the aforementioned range.

When a difference between the content ratio of impurity metal in the first transparent conductive thin film and the content ratio of impurity metal in other transparent conductive thin film is excessively small, a physical difference between the thin films in the transparent conductive thin film laminate 2 is small, and therefore its physical properties are similar to those of a transparent conductive thin film laminate having only one transparent conductive thin film as shown in FIG. 4. On the other hand, when a difference in content of impurity metal is excessively large, productivity may be deteriorated because crystallization of a transparent conductive thin film having a high impurity metal content is hindered, and so on, or it may be difficult to lower the resistance of the transparent conductive thin film laminate.

The content ratio of impurity metal in the first transparent conductive thin film 21 that is closest to the metal layer 3 is preferably 0.08 or less, preferably less than 0.08, more preferably 0.05 or less. When the impurity metal content ratio of the first transparent conductive thin film becomes higher, the surface resistance of the conductive thin film laminate tends to increase when the metal layer 3 is etched. The range of the content ratio of the impurity metal is generally 8% or 5% in terms of a difference in Sn atom content between the transparent conductive thin film on the transparent base side and the first transparent conductive thin film 21 on the metal layer side (weight of $SnO_2$ relative to the total weight of $In_2O_3$ and $SnO_2$) where an indium-tin composite oxide (ITO) is used as the composite metal oxide thin film which forms the transparent conductive thin film. The minimum value of the content ratio of impurity metal in the first transparent conductive thin film 21 is 0. That is, the first transparent conductive thin film 21 may be an oxide film of a single metal such as, for example, indium oxide.

The content ratio of impurity metal in a transparent conductive thin film having the highest content ratio of impurity metal in the transparent conductive thin film laminate 2 is preferably 0.04 to 0.31, more preferably 0.04 to 0.24. When the transparent conductive thin film laminate 2 includes two transparent conductive thin films as shown in FIG. 1, the content ratio of impurity metal in the transparent conductive thin film 22 on the transparent base 1 side is preferably in the aforementioned range. When the transparent conductive thin film laminate 2 includes three or more transparent conductive thin films as shown in FIG. 2, the content ratio of impurity metal in a transparent conductive thin film having the highest content ratio of impurity metal in the transparent conductive thin film laminate 2 should be in the aforementioned range. For decreasing the specific resistivity of the transparent conductive thin film laminate 2, the content ratio of impurity metal where any transparent conductive thin film(s) other than the first transparent conductive thin film 21 on a side close to the metal layer 3 in the transparent conductive thin film laminate 2 are considered as one film is especially preferably in the aforementioned range. The range of the content ratio of the impurity metal is generally 4% to 25% or 4% to 21% in terms of a difference in Sn atom content between the transparent conductive thin film on the transparent base side and the first transparent conductive thin film 21 on the metal layer side (weight of $SnO_2$ relative to the total weight of $In_2O_3$ and $SnO_2$) where an indium-tin composite oxide (ITO) is used as the composite metal oxide thin film which forms the transparent conductive thin film.

The thickness of the first transparent conductive thin film 21 is preferably 1 nm or more. Further, the thickness of the first transparent conductive thin film 21 is preferably 1 nm to 17 nm, more preferably 1 nm to 12 nm, further preferably 1 nm to 6 nm. The total thickness of a transparent conductive thin film other than the first transparent conductive thin film 21 in the transparent conductive thin film laminate 2 is preferably 9 nm to 34 nm, more preferably 9 to 29 nm, further preferably 9 to 24 nm. For the thickness of each layer, the aforementioned range can be employed, but for decreasing the specific resistivity of the transparent conductive thin film laminate, it is preferable to form each transparent conductive thin film such that the thickness of the first transparent conductive thin film 21 is smaller than the total thickness of a transparent conductive thin film other than the first transparent conductive thin film 21. A difference between the thickness of the first transparent conductive thin film 21 and the total thickness of a transparent conductive thin film other than the first transparent conductive thin film 21 is preferably 1 nm or more, more preferably 1 nm to 33 nm, further preferably 1 nm to 20 nm.

For ensuring that the laminate has a high transmittance, the thickness of the whole transparent conductive thin film laminate is preferably 35 nm or less, preferably 30 nm or less. The ratio of the thickness of the first transparent conductive thin film 21 to the thickness of the whole transparent conductive thin film laminate 2 is preferably 6% or more, more preferably 6% to 45%, further preferably 6% to 35%. When the thickness ratio is in the aforementioned range, a transparent conductive film which is excellent in resistance stability can be obtained with high production efficiency because the crystallization rate is enhanced while the transparent conductive thin film laminate retains low-resistance property.

The method for formation of each transparent conductive thin film which forms the transparent conductive thin film laminate is not particularly limited, and a previously known method can be employed. Specifically, for example, a vacuum deposition method, a sputtering method and an ion plating method can be mentioned. An appropriate method can be employed according to a required film thickness.

Each transparent conductive thin film may be crystalline, or may be amorphous. For example, when a plastic film is used as a transparent base and an ITO film is formed as a transparent conductive thin film by a sputtering method, film formation by sputtering cannot be performed at a high temperature because there is a limitation associated with the heat resistance of the base. Therefore, the transparent conductive thin film immediately after being formed is often an amorphous film (partially crystallized in some cases). Such an amorphous transparent conductive thin film has a low transmittance as compared to a crystalline counterpart, and may cause such a problem that a change in resistance after a humidification-heating test is significant. From such a viewpoint, an amorphous transparent conductive thin film may be once formed, and then converted into a crystalline film by heating in the presence of oxygen in the air. Crystallization of the transparent conductive thin film leads to the advantage that transparency is improved, the resistance is lowered, and a change in resistance after a humidification-heating test is small, so that humidification-heating reliability is improved.

Crystallization of each transparent conductive thin film may be performed before the metal layer 3 is formed and after an amorphous film is formed on the transparent base 1, or the crystallization may be performed after the metal layer is formed. When the transparent conductive thin film laminate is patterned by etching or the like, crystallization of the transparent conductive thin film may be performed before etching processing, or may be performed after etching processing.

(Metal Layer)

The metal layer 3 is formed on the transparent conductive thin film laminate 2. A thin film having a thickness of, for example, 5 nm or less can also be provided between the first transparent conductive thin film 21 and the metal layer 3 for improving adhesion between the transparent conductive thin film laminate and the metal layer, preventing diffusion of metal elements, which form the metal layer, into the transparent conductive layer, and so on. On the other hand, it is preferable to form the metal layer 3 directly on the first transparent conductive thin film 21 for suppressing an increase in surface resistance of the transparent conductive thin film laminate when the metal layer 3 is removed by etching.

The constituent material of the metal layer is not particularly limited as long as it has conductivity, and for example, metals such as Ti, Si, Nb, In, Zn, Sn, Au, Ag, Cu, Al, Co, Cr, Ni, Pb, Pd, Pt, W, Zr, Ta and Hf are suitably used. Further, a material containing two or more of these metals, an alloy having some of these metals as a principal component, or the like can be suitably used. When patterned wiring as shown in FIG. 5 is formed by removing a part in the surface of the metal layer 3 by etching or the like after a conductive laminate is formed, a metal having high conductivity, such as Au, Ag or Cu, is suitably used as a material of the metal layer 3. Particularly, Cu is a material which has high conductivity and is inexpensive, and therefore is suitable as a material for forming wiring. Therefore, especially preferably the metal layer 3 is substantially formed of copper.

The thickness of the metal layer 3 is not particularly limited. For example, when patterned wiring is formed by removing a part in the surface of the metal layer 3 by etching or the like after a conductive film is formed, the thickness of the metal layer 3 is appropriately set so that the formed patterned wiring has a desired resistance value. When the thickness of the metal layer is excessively small, power consumption of a device may be increased because the resistance of patterned wiring becomes excessively high. Therefore, the thickness of the metal layer is preferably 20 nm or more. When conversely the thickness of the metal layer is excessively large, productivity is deteriorated because much time is required for formation of the metal layer, and also heat creases tend to easily occur in the film because the integrated heat amount during film formation increases and it is necessary to increase the power density during film formation. From such a viewpoint, the thickness of the metal layer is preferably 20 nm to 500 nm.

Preferably the metal layer is formed by a vacuum film formation method such as a chemical vapor deposition (CVD) method or a physical vapor deposition (PVD) method, a plating method (electrolytic plating or electroless plating), or the like from the viewpoint of uniformity of the film thickness and film formation efficiency. Further, two or more of these film formation methods may be combined. Particularly, physical vapor deposition methods such as a vacuum vapor deposition method, a sputtering method, an ion plating method and an electron beam deposition method are preferable, and a sputtering method is especially preferable.

A second metal layer 4 intended for prevention of oxidation may be further provided on the metal layer 3 as shown in FIG. 3. For example, when the second metal layer 4 having a composition different from that of the metal layer 3 is provided on the metal layer 3, a situation can be inhibited in which the metal layer 3 is oxidized by heating during crystallization of the transparent conductive thin film or heating during assembly of a device such as a touch panel, so that the resistance of wiring is increased. The second metal layer is preferably one that is hard to be oxidized even when heated in the presence of oxygen, and can be etched in parallel to etching of the metal layer 3 using the same etchant. When a plurality of metal layers 3 and 4 can be patterned by one time of etching, patterned wiring can be easily formed.

When the metal layer 3 is substantially formed of copper, it is preferable that the second metal layer 4 provided on the metal layer for the purpose of prevention of oxidation is formed of a copper-nickel alloy, and contains 15 to 55 parts by weight of nickel based on 100 parts by weight of the total of copper and nickel. The thickness of the second metal layer is preferably 5 nm to 100 nm, more preferably 5 nm to 80 nm, more preferably 5 nm to 70 nm. When the thickness of the second metal layer is excessively small, an effect as an oxidation prevention layer is not exhibited, and the metal layer substantially formed of copper tends to be easily oxidized when heated in the presence of oxygen. On the other hand, when the thickness of the second metal layer is excessively large, productivity is deteriorated because much time is required for film formation, and also extended time may be required when a part in the surface of the metal layer is removed by etching or the like to form patterned wiring.

<Transparent Conductive Laminate>

The conductive laminate 10 of the present invention described above is suitable for formation of a transparent conductive laminate with patterned wiring. FIG. 5 is a plan view schematically showing one embodiment of a transparent conductive laminate with patterned wiring, and FIG. 6 is a sectional view schematically showing a cross section along the VI-VI line in FIG. 5. A transparent conductive laminate 100 with patterned wiring has a transparent electrode portion including a plurality of patterned transparent electrodes 121 to 126, and patterned wiring portions 131a to 136a and 131b to 136b. Patterned wirings are connected to the transparent electrodes. For example, the transparent electrode portion 121 in FIG. 5 is connected to the patterned wirings 131a and 131b. As schematically shown in FIG. 6, the transparent electrode 121 is a region having the transparent conductive thin film laminate 2 on the transparent base 1, and the patterned wirings 131a and 131b are regions having the transparent conductive thin film laminate 2 and the metal layer 3 in this order on the transparent base 1. In FIG. 5, each transparent electrode is patterned in a stripe form, and the both ends thereof are connected to patterned wiring, but the shape of the transparent electrode is not limited to a stripe shape, and the transparent electrode may be connected to patterned wiring at one location or three or more locations. Each patterned wiring is connected to control means 150 such as an IC as necessary.

Figure 7:
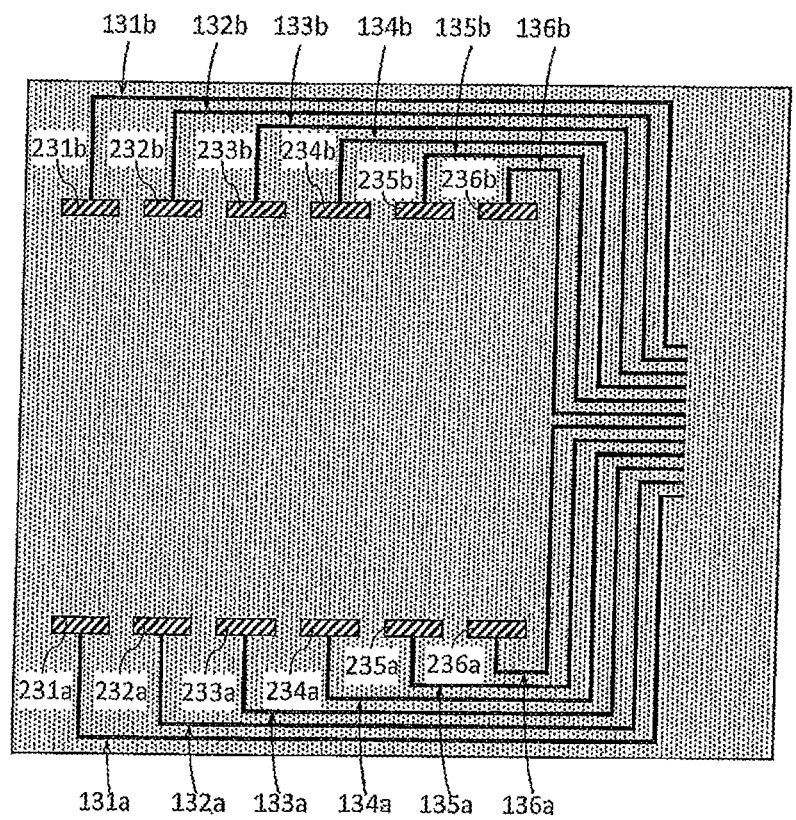
FIG. 7 is a schematic plan view for explaining a production process of a transparent conductive laminate with patterned wiring.

Such a transparent conductive laminate with patterned wiring can be formed by removing the transparent conductive thin film laminate 2 and the metal layer 3 of the conductive laminate by etching or the like to perform patterning. Specifically, first a part in the surface of the metal layer 3 is removed to form patterned wiring. At this time, processing is performed so that the metal layer 3 remains in the patterned wiring portions 131a to 136b and 131b to 136b. Preferably processing is performed so that the metal layer 3 remains also in connection portions 231a to 236a and 231b to 236b between transparent electrodes and patterned wiring as shown in FIG. 7. The connection portions between patterned wiring and transparent electrodes partially form patterned wiring portions.

It is preferable to perform removal of the metal layer 3 by etching. For etching, a method is suitably used in which the metal layer 3 is etched with an etchant while the surfaces of regions corresponding to patterned wiring portions and connection portions are covered with a mask for forming a pattern. When the second metal layer 4 is formed on the metal layer for the purpose of preventing oxidation, it is preferable to remove the metal layer 3 and the second metal layer 4 in parallel by one time etching processing. Examples of the etchant include a cupric chloride solution, a ferric chloride solution and a copper-ammonia complex solution. Particularly, an etchant which does not exhibit an etching capability to the transparent conductive thin film, or an etchant with which the etching rate for the transparent conductive thin film is lower than the etching rate for the metal layer is suitably used.

After the metal layer 3 is removed, a part in the surface of the transparent conductive thin film laminate 2 is removed at exposed portions of the transparent conductive thin film laminate 2, to form patterned transparent electrodes 121 to 126 as shown in FIG. 5. It is preferable to perform removal of the transparent conductive thin film laminate 2 by etching. For etching, a method is suitably used in which the transparent conductive thin film laminate is etched with an etchant while the surfaces of regions corresponding to the transparent electrode portions 121 to 126 are covered with a mask for forming a pattern. When an etchant having an etching capability to the metal layer 3 as well is used, it is preferable that the surfaces of the patterned wiring portions and connection portions are also covered with a mask.

An etchant to be used for etching of the transparent conductive thin film can be appropriately selected according to a material for forming the transparent conductive thin film. When a conductive oxide such as ITO is used for the transparent conductive thin film, an acid is suitably used as an etchant. Examples of the acid include inorganic acids such as hydrogen chloride, hydrogen bromide, sulfuric acid, nitric acid and phosphoric acid, organic acids such as acetic acid, mixtures thereof, and aqueous solutions thereof.

When the transparent conductive thin film is amorphous, it may be crystallized by heating in the presence of oxygen in the air. Crystallization conditions can be appropriately set, but when the transparent conductive thin film is formed from ITO, it should be heated, for example, at a temperature ranging from 100° C. to 180° C. for about 15 to 180 minutes. The phrase "the transparent conductive thin film is crystalline" means that crystallized grains exist over the entire surface in observation with a transmission electron microscope (TEM). When the transparent conductive thin film is formed from ITO, whether it is crystalline or not can be determined as follows: a laminate is immersed in hydrochloric acid at a concentration of 5 wt % for 15 minutes, and then washed with water and dried, and an interterminal resistance at an interval of 15 mm is measured using a tester. Since an amorphous ITO film is etched with hydrochloric acid to disappear, the resistance is increased due to immersion in hydrochloric acid. Herein, an ITO film is considered amorphous in the case where the interterminal resistance at an interval of 15 mm is more than 10 kΩ after the film is immersed in hydrochloric acid, washed with water and dried.

Crystallization of the transparent conductive thin film may be performed either before formation of patterned wiring by removal of the metal layer, or after formation of patterned wiring and before formation of transparent electrodes by removal of the transparent conductive thin film laminate, or after formation of transparent electrodes.

For the conductive laminate of the present invention, a composite metal oxide having a relatively high content ratio of impurity metal is used for the transparent conductive thin film 21 on the metal layer 3 side of the transparent conductive thin film laminate 2, and therefore an increase in surface resistance of the transparent conductive thin film laminate after removal of the metal layer 3 by etching is suppressed. Therefore, a transparent conductive laminate with patterned wiring, which has low-resistance transparent electrodes, can be obtained with high productivity.

<Optical Device>

The transparent conductive laminate with patterned wiring, which is obtained in the manner described above, is provided on a substrate with control means 150 such as an IC as necessary, and put to practical use. The transparent conductive laminate of the present invention is suitably used for various kinds of optical devices because it has patterned transparent electrodes and the transparent electrodes are connected to patterned wirings. Examples of the devices include touch panels, flat panel displays such as a liquid crystal display, a plasma display and an organic electro-luminescent display, and illuminators. Examples of the touch panel include capacitive touch panels and resistive touch panels.

In formation of such an optical device, a transparent conductive laminate with patterned wiring may be used as such, or a laminate obtained by providing an additional layer on a transparent electrode may be used. For example, in the organic electro-luminescent display, a light emitting layer, and a metal electrode layer capable of acting as a cathode, etc. can be provided on a transparent electrode capable of acting as an anode.

EXAMPLES

A conductive laminate of the present invention will be described in detail below with reference to examples, but the present invention is not limited to the examples as long as the spirit of the present invention is maintained.

Example 1

Preparation of Transparent Conductive Film

Using a photocurable resin (trade name "OPSTAR KZ6661" manufactured by JSR Corporation), a dielectric layer having a thickness of 100 nm was formed on one surface of a film base formed of a polycarbonate-based film having a thickness of 75 μm. A second transparent conductive thin film formed of an indium-tin composite oxide with a Sn/In ratio, i.e. a ratio of the number of atoms of Sn to In, of 0.10 was formed in a thickness of 20 nm on the dielectric layer by a DC magnetron sputtering method using a target material made of a sintered body having indium oxide and tin oxide at a weight ratio of 90:10 under reduced pressure while Ar and $O_2$ were introduced. A first transparent conductive thin film formed of an indium-tin composite oxide with a Sn/In ratio, i.e. a ratio of the number of atoms of Sn to In, of 0.03 was formed in a thickness of 6 nm on the second transparent conductive thin film by a DC magnetron sputtering method using a target material made of a sintered body having indium oxide and tin oxide at a weight ratio of 97:3. In this way, a transparent conductive film having, on a polycarbonate film base, a transparent conductive thin film laminate including an ITO film having a Sn/In ratio of 0.10 and a thickness of 20 nm and an ITO film having a Sn/In ratio of 0.03 and a thickness of 6 nm was obtained.

Formation of Metal Layer

A metal layer formed of copper was formed in a thickness of 50 nm on the first transparent conductive thin film of the transparent conductive film by a DC magnetron sputtering method using an oxygen-free copper target under reduced pressure while Ar was introduced, thereby obtaining a conductive laminate.

Example 2

Using a thermosetting resin (light refractive index n=1.54) of a melamine resin:alkyd resin:organic silane condensate at a weight ratio of 2:2:1, a dielectric layer having a thickness of 35 nm was formed on one surface of a film base formed of a polyethylene terephthalate film having a thickness of 23 μm. An ITO film (second transparent conductive thin film) having a Sn/In ratio of 0.10 and a thickness of 20 nm and an ITO film (first transparent conductive thin film) having a Sn/In ratio of 0.03 and a thickness of 6 nm were sequentially formed, in the same manner as in Example 1, on the dielectric layer to obtain a transparent conductive film. A metal layer formed of copper was formed in a thickness of 50 nm, in the same manner as in Example 1, on the first transparent conductive thin film of the transparent conductive film to obtain a conductive laminate.

Example 3

A dielectric layer was formed, in the same manner as in Example 2, on one surface of a film base formed of a polyethylene terephthalate film having a thickness of 50 μm. An ITO film having a Sn/In ratio of 0.10 and a thickness of 26 nm and an ITO film having a Sn/In ratio of 0.03 and a thickness of 2 nm were sequentially formed, in the same manner as in Example 1, on the dielectric layer to obtain a transparent conductive film. A metal layer formed of copper was formed in a thickness of 50 nm, in the same manner as in Example 1, on the first transparent conductive thin film of the transparent conductive film to obtain a conductive laminate.

Examples 4 to 10 and Comparative Example 4

A conductive laminate was obtained in the same manner as in Example 3 except that the ratio of indium oxide to tin oxide in the target used for formation of an ITO film, and the film formation thickness were changed as shown in Table 1.

Comparative Example 1

A dielectric layer was formed, in the same manner as in Example 2, on one surface of a film base formed of a polyethylene terephthalate film having a thickness of 50 μm. A transparent conductive thin film formed of an indium-tin composite oxide with a Sn/In ratio, i.e. a ratio of the number of atoms of Sn to In, of 0.10 was formed in a thickness of 20 nm on the dielectric layer by a DC magnetron sputtering method using a target material made of a sintered body having indium oxide and tin oxide at a weight ratio of 90:10 under reduced pressure while Ar and $O_2$ were introduced, thereby obtaining a transparent conductive film having only one transparent conductive thin film on a base. A metal layer formed of copper was formed in a thickness of 50 nm, in the same manner as in Example 1, on the transparent conductive thin film of the transparent conductive film to obtain a conductive laminate.

Comparative Example 2

A dielectric layer was formed on one surface of a polyethylene terephthalate film base having a thickness of 50 μm in the same manner as in Example 3. An ITO film with a Sn/In ratio of 0.08 was formed in a thickness of 25 nm, in the same manner as in Comparative Example 1, on the dielectric layer, and a metal layer formed of copper was formed thereon in a thickness of 50 nm to obtain a conductive laminate.

Comparative Example 3

A conductive laminate was obtained in the same manner as in Comparative Example 2 except that the weight ratio of indium oxide to tin oxide in the target used for formation of an ITO film was changed to 88:12 (Sn/In ratio in ITO film=0.13) in Comparative Example 2 described above.
<Evaluation>

The conductive laminate obtained in each of examples and comparative examples was immersed, under room temperature for 10 minutes, in a solution (etchant) prepared by mixing 8 parts by weight of ammonium chloride with 100 parts by weight of an aqueous ammonia solution (concentration: 8% by weight), thereby etching away the copper layer.

Each of the transparent conductive film before formation of the copper layer and the transparent conductive film in which the copper layer was removed from the conductive laminate was heated in a hot air oven at 140° C. for 90 minutes to crystallize the ITO. The surface resistance of the conductive thin film (laminate) after crystallization was measured using a four-terminal method.

The amount (% by weight) of tin oxide relative to the total of indium oxide and tin oxide in the target used for formation of the ITO film in each of examples and comparative examples, the Sn/In ratio in the ITO film, and the surface resistances before and after removal of the copper layer by etching are shown in Table 1. In Table 1, ITO 1 denotes the first transparent conductive thin film (ITO film on the metal layer side), and ITO 2 denotes the second transparent conductive thin film (ITO film on the base side).

TABLE 1

| | Target Content of SnO$_2$ (wt %) | | Sn/In | | Thickness (nm) | | Surface resistance ($\Omega/\square$) | |
|---|---|---|---|---|---|---|---|---|
| | | | ITO film | | | | Before formation of copper layer | After removal of copper layer |
| | ITO1 | ITO2 | ITO1 | ITO2 | ITO1 | ITO2 | | |
| Example 1 | 3 | 10 | 0.03 | 0.10 | 6 | 20 | 138 | 138 |
| Example 2 | 3 | 10 | 0.03 | 0.10 | 6 | 20 | 136 | 137 |
| Example 3 | 3 | 10 | 0.03 | 0.10 | 2 | 26 | 127 | 128 |
| Example 4 | 3 | 10 | 0.03 | 0.10 | 3 | 25 | 129 | 132 |
| Example 5 | 3 | 10 | 0.03 | 0.10 | 5 | 23 | 131 | 130 |
| Example 6 | 3 | 10 | 0.03 | 0.10 | 6 | 22 | 134 | 136 |
| Example 7 | 3 | 10 | 0.03 | 0.10 | 9 | 19 | 145 | 144 |
| Example 8 | 3 | 8 | 0.03 | 0.08 | 3 | 25 | 163 | 163 |
| Example 9 | 3 | 12 | 0.03 | 0.12 | 3 | 25 | 116 | 117 |
| Example 10 | 2 | 10 | 0.02 | 0.10 | 3 | 25 | 132 | 133 |
| Comparative Example 1 | | 10 | | 0.10 | | 25 | 142 | 154 |
| Comparative Example 2 | | 8 | | 0.08 | | 25 | 172 | 185 |
| Comparative Example 3 | | 12 | | 0.12 | | 25 | 122 | 138 |
| Comparative Example 4 | 10 | 3 | 0.10 | 0.03 | 25 | 3 | 134 | 148 |

In Comparative Examples 1 to 3 with only one transparent conductive thin film on the base, the surface resistance in the case where the copper layer was etched away after formation thereof was increased by about 8 to 13% as compared to that before formation of the copper layer. Also in Comparative Example 2 where the content ratio of the impurity metal (Sn) in the transparent conductive thin film (ITO 1) on the metal layer side was higher than that in the transparent conductive thin film (ITO 2) on the base side, an increase in surface resistance was observed. In contrast, in Examples 1 to 10, a change in resistance was insignificant after the copper layer was etched away. Thus, it is apparent that an increase in resistance is suppressed by forming the first transparent conductive thin film having a low Sn content.

DESCRIPTION OF REFERENCE SIGNS

1 transparent base
2 transparent conductive thin film laminate
21, 22, 23, 25 transparent conductive thin film
3, 4 metal layer
10 conductive laminate
100 transparent conductive laminate
121 to 126 transparent electrode
131 to 136 patterned wiring
231 to 236 connection portion
150 control means

The invention claimed is:
1. A conductive laminate, comprising:
a transparent conductive thin film laminate including at least two transparent conductive thin films and a metal layer formed in this order on at least one surface of a transparent base, wherein
a first transparent conductive thin film that is closest to the metal layer in the transparent conductive thin film laminate is a metal oxide layer, or a composite metal oxide layer containing a principal metal and at least one impurity metal, and a transparent conductive thin film other than the first transparent conductive thin film is a composite metal oxide layer containing a principal metal and at least one impurity metal,
a content ratio of impurity metal in the first transparent conductive thin film is not the highest of content ratios of impurity metal in the transparent conductive thin films which form the transparent conductive thin film laminate,
wherein all transparent conductive thin films, which form the transparent conductive thin film laminate, are crystalline films,
wherein the thickness of the first transparent conductive thin film is 1 nm to 17 nm, and wherein the total thickness of the transparent conductive thin film other than the first transparent conductive thin film in the transparent conductive thin film laminate is 9 nm to 34 nm.

2. The conductive laminate according to claim 1, wherein the content ratio of impurity metal in the first transparent conductive thin film is the lowest of the content ratios of impurity metal in the transparent conductive thin films which form the transparent conductive thin film laminate.

3. The conductive laminate according to claim 1, wherein a difference between a content ratio of impurity metal in a transparent conductive thin film having the highest content ratio of impurity metal in the transparent conductive thin film laminate and the content ratio of impurity metal in the first transparent conductive thin film is 0.005 to 0.23.

4. The conductive laminate according to claim 1, wherein the content ratio of impurity metal in the first transparent conductive thin film is 0.08 or less.

5. The conductive laminate according to claim 1, wherein a content ratio of impurity metal in a transparent conductive thin film having the highest content ratio of impurity metal in the transparent conductive thin film laminate is 0.04 to 0.31.

6. The conductive laminate according to claim 1, wherein a thickness of the first transparent conductive thin film is 6% or more based on the total thickness of the transparent conductive thin film laminate.

7. The conductive laminate according to claim 1, wherein all transparent conductive thin films, which form the transparent conductive thin film laminate, have In as a principal metal.

8. The conductive laminate according to claim 7, wherein all transparent conductive thin films, which form the transparent conductive thin film laminate, contain Sn as an impurity metal.

9. The conductive laminate according to claim 8, wherein a content ratio of Sn to In in the first transparent conductive thin film is 0.08 or less, and an entire content ratio of Sn to In in a transparent conductive thin film, other than the first transparent conductive thin film, which forms the transparent conductive thin film laminate, is 0.08 to 0.13.

10. The conductive laminate according to claim 1, wherein the transparent conductive thin film laminate comprises two layers: the first transparent conductive thin film and one transparent conductive thin film formed on the base side from the first transparent conductive thin film.

11. The conductive laminate according to claim 1, wherein the first transparent conductive thin film and the metal layer are adjacent to each other.

12. The conductive laminate according to claim 1, wherein the transparent base is a flexible film.

13. A transparent conductive laminate with patterned wiring, which can be obtained by
removing a part in a surface of the metal layer of the conductive laminate according to claim 1 by etching to form patterned wiring portions, and
removing a part in a surface of the transparent conductive thin film laminate by etching, at exposed portions of the transparent conductive thin film laminate where the metal layer is removed, to form patterned transparent electrodes.

14. An optical device comprising the transparent conductive laminate with patterned wiring according to claim 13.

15. A touch panel comprising the transparent conductive laminate with patterned wiring according to claim 13.

16. A method for producing a transparent conductive laminate with patterned wiring, which has a transparent base, and a transparent electrode portion including a plurality of patterned transparent electrodes, and patterned wiring portions on the transparent base, the patterned wiring portions being connected to the transparent electrodes, the method comprising the steps of:
providing the conductive laminate according to claim 1;
removing a part in a surface of the metal layer by etching to form patterned wiring portions; and
removing a part in a surface of the transparent conductive thin film laminate by etching, at exposed portions of the transparent conductive thin film laminate where the metal layer is removed, to form patterned transparent electrodes, in this order.

17. The method for producing a transparent conductive laminate with patterned wiring according to claim 16, further comprising a step of heating the laminate to crystallize the transparent conductive layer.

18. A transparent conductive laminate with patterned wiring, comprising:
a transparent base, and
a transparent electrode portion including a plurality of patterned transparent electrodes, and patterned wiring portions on the transparent base, the patterned wiring portions being connected to the transparent electrode portions, wherein
the patterned wiring portion has on the transparent base a transparent conductive thin film laminate including at least two transparent conductive thin films, and a metal layer in this order,
the transparent electrode portion has the transparent conductive thin film laminate on the transparent base,
a content ratio of impurity metal in a first transparent conductive thin film that is closest to the metal layer in the transparent conductive thin film laminate is not the highest of content ratios of impurity metal in transparent conductive thin films which form the transparent conductive thin film laminate,
wherein all transparent conductive thin films, which form the transparent conductive thin film laminate, are crystalline films,
wherein the thickness of the first transparent conductive thin film is 1 nm to 17 nm, and
wherein the total thickness of a transparent conductive thin film other than the first transparent conductive thin film in the transparent conductive thin film laminate is 9 nm to 34 nm.

19. An optical device comprising the transparent conductive laminate with patterned wiring according to claim 18.

20. A touch panel comprising the transparent conductive laminate with patterned wiring according to claim 18.

* * * * *